United States Patent
Toyoshima

(10) Patent No.: US 10,875,216 B2
(45) Date of Patent: Dec. 29, 2020

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Takahiro Toyoshima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 540 days.

(21) Appl. No.: 15/096,602

(22) Filed: Apr. 12, 2016

(65) Prior Publication Data

US 2016/0297116 A1    Oct. 13, 2016

(30) Foreign Application Priority Data

Apr. 13, 2015   (JP) .................................. 2015-081355

(51) Int. Cl.
   *B29C 43/02* (2006.01)
   *B29C 43/56* (2006.01)
   *G03F 7/00* (2006.01)

(52) U.S. Cl.
   CPC ............ *B29C 43/56* (2013.01); *G03F 7/0002* (2013.01); *B29C 2043/025* (2013.01); *B29C 2043/566* (2013.01)

(58) Field of Classification Search
   CPC .. B29C 43/56; B29C 2043/566; G03F 7/0002
   See application file for complete search history.

(56) References Cited

U.S. PATENT DOCUMENTS

| | | | |
|---|---|---|---|
| 6,569,774 B1 * | 5/2003 | Trapp ................ | H01L 21/31116 257/E21.252 |
| 7,090,716 B2 | 8/2006 | McMackin et al. | |
| 2015/0224703 A1 * | 8/2015 | Oda ...................... | B29C 59/022 264/447 |

FOREIGN PATENT DOCUMENTS

| | | |
|---|---|---|
| JP | 5975626 A | 4/1984 |
| JP | 2004103817 A | 4/2004 |
| JP | 2007509769 A | 4/2007 |

(Continued)

OTHER PUBLICATIONS

Office Action issued in Japanese Appln. No. 2015-081355 dated Mar. 5, 2019. English translation provided.

*Primary Examiner* — Monica A Huson
*Assistant Examiner* — Kelsey C Grace
(74) *Attorney, Agent, or Firm* — Rossi, Kimms & McDowell LLP

(57) ABSTRACT

An imprint apparatus that forms a pattern on a substrate by using a mold, the apparatus comprises a supply unit configured to supply an imprint material to the substrate; a contact unit configured to contact the imprint material that has been supplied to the substrate with a mold; a substrate stage configured to move the substrate; a gas supply unit that is provided between the supply unit and the contact unit, and supply gas toward the substrate; and a flow volume adjustment unit configured to adjust a flow volume of the gas that is supplied from the gas supply unit, while the substrate stage moves the substrate from a supply position at which the imprint material is supplied by the supply unit to a contact position at which the imprint material is contacted with the mold by the contact unit.

12 Claims, 4 Drawing Sheets

(56) References Cited

FOREIGN PATENT DOCUMENTS

| JP | 2013229448 A | * | 11/2013 |
| JP | 2013229448 A | | 11/2013 |

* cited by examiner

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

There is a fine processing technique that contacts a mold with an imprint material on a substrate and performs pattern formation. This technique is also referred to as "imprint technique", and enables forming a pattern of a few nm order on the substrate. A light curing method is an example of the imprint technique. An imprint apparatus using this method forms a pattern on a substrate by applying a photo curing resin (imprint material) to a shot (imprint region) on the substrate, contacting the mold with the imprint material (mold pressing), curing the imprint material, and peeling away the mold (mold releasing). In mold pressing, if particles adhere to the imprint material or the mold, a pattern defect may occur or the mold may be damaged. Additionally, a pattern defect may occur due to the mixture of air (residual gas) between the imprint material and the mold in the imprint material that has not been cured as bubbles.

For this drawback related to the adhesion of particles, Japanese Patent Application Laid-Open Publication No. 59-75626 discloses a pattern forming apparatus in which an area around a head holding a mold is surrounded by an air flow to avoid the entry of particles into the area around the head. For the drawback related to the residual gas, an imprint apparatus in which the residual gas is reduced by using permeable gas in an imprint atmosphere (Japanese Patent Application Laid-Open Publication No. 2007-509769), and an imprint apparatus in which condensable gas that is liquefied during the pressing of the mold and the volume thereof becomes reduced to a negligible extent is used (Japanese Patent Application Laid-Open Publication No. 2004-103817) are disclosed.

However, when the technique of Japanese Patent Application Laid-Open Publication No. 59-75626 is applied to the imprint apparatus, a drop is volatilized/dried due to the air flow hitting the imprint material (drop) that has not been cured, and the shape may change. Here, volatilized/dried means at least any one of volatilized and dried, volatilized, or dried. Moreover, in the case in which the techniques disclosed in Japanese Patent Application Laid-Open Publication No. 2007-509769 and Japanese Patent Application Laid-Open Publication No. 2004-103817 are also used together, if the air flow is mixed with permeable gas and condensable gas, the residual gas might not sufficiently be removed. Both could be a cause of occurrence of pattern defects.

SUMMARY OF THE INVENTION

The present invention provides, for example, an imprint apparatus that is advantageous in reducing pattern defects.

The present invention is an imprint apparatus that forms a pattern on a substrate by using a mold, the apparatus comprises a supply unit configured to supply an imprint material to the substrate; a contact unit configured to contact the imprint material that has been supplied to the substrate with a mold; a substrate stage configured to move the substrate; a gas supply unit that is provided between the supply unit and the contact unit, and configured to supply gas toward the substrate; and a flow volume adjustment unit that is configured to adjust a flow volume of the gas that is supplied from the gas supply unit, while the substrate stage moves the substrate from a supply position at which the imprint material is supplied by the supply unit to a contact position at which the imprint material is contacted with the mold by the contact unit.

Further features of the present invention will become apparent from the following description of exemplary embodiments (with reference to the attached drawings).

DESCRIPTION OF THE EMBODIMENTS

Hereinafter, a description will be given of embodiments of the present invention with reference to the accompanying drawings and the like.

First Embodiment

Figure 1:
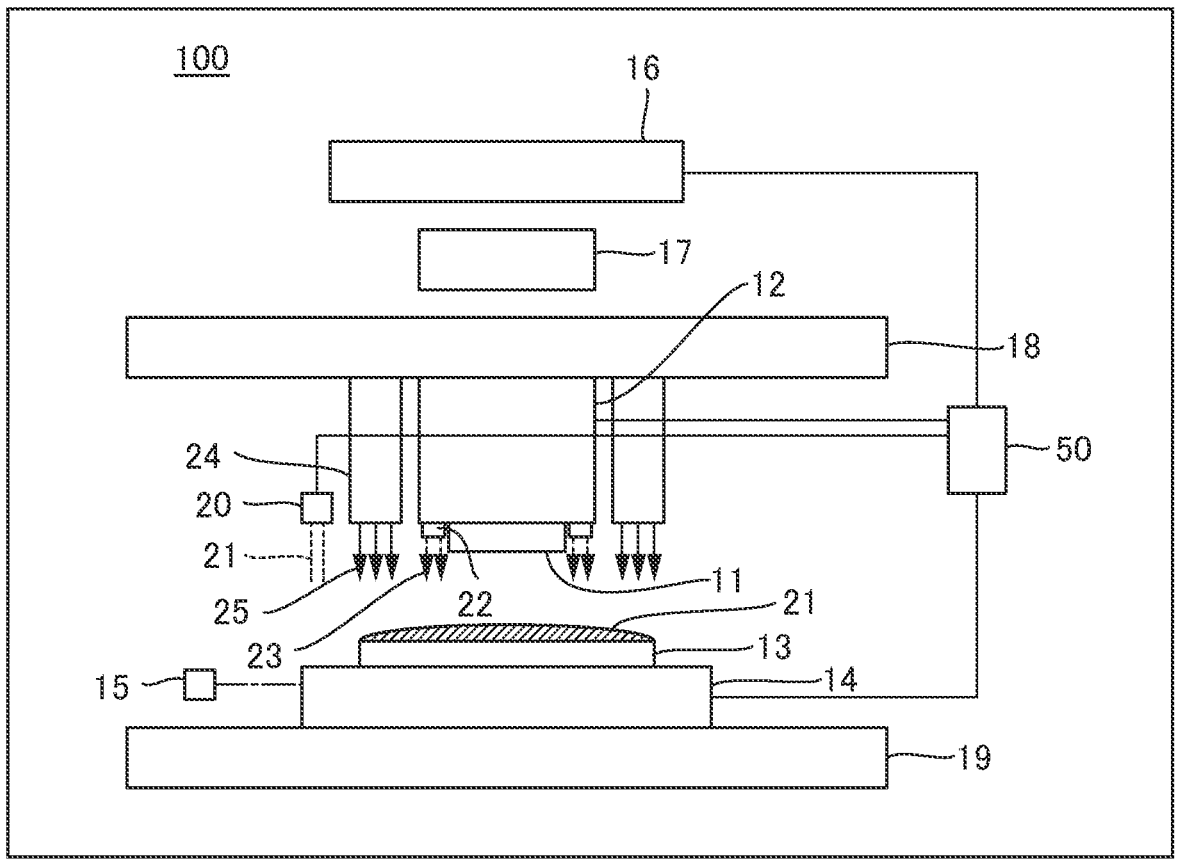
FIG. 1 is a schematic diagram illustrating a configuration of an imprint apparatus according to a first embodiment.

FIG. 1 is a schematic diagram illustrating a configuration of an imprint apparatus according to a first embodiment of the present invention. Here, as an imprint apparatus using a photo curing method, an ultraviolet rays curing imprint apparatus that cures an uncured resin (imprint material) on a substrate by irradiation of ultraviolet rays is used. However, as a curing method for imprint materials, a method using irradiation of lights in other wavelength ranges, or a method using other energies (for example, heat) may be used. An imprint apparatus 100 has a mold press unit (mold holding unit, contact unit) 12 that presses a mold 11 having a pattern surface to the imprint material (contacts the mold with the imprint material), a substrate stage (substrate holding unit) 14, a light source 16, an illumination optical system 17, an application unit (dispenser, supply unit) 20, and a control unit 50.

The mold press unit 12 is supported by being attached to a structure 18 and movable by a drive source (not illustrated) and the control unit 50. When the mold 11 makes contact with a resin 21 that has been applied onto a substrate 13 by the application unit 20 (mold pressing), the mold press unit 12 moves such that the mold 11 approaches the substrate 13. Additionally, when the mold is peeled away (mold releasing), the mold press unit 12 moves such that the mold 11 is away from the substrate 13.

The substrate stage 14 is movable on a base 19 between a position facing the application unit 20 (application position) and a position facing the mold press unit 12 (mold 11) (contact position) by the drive source (not illustrated) and the control unit 50. The control unit 50 measures the position of the substrate stage 14 by a detection unit 15, and performs positioning control of the substrate stage 14 with an accuracy of a few nm or less by a control mechanism (not illustrated) and an alignment mechanism (not illustrated). As the detection unit 15, a laser interferometer or an encoder can be used.

The light source 16 and the illumination optical system 17 irradiate ultraviolet rays that cure the resin 21. The application unit 20 has a nozzle (supply opening) that discharges the resin 21. The control unit 50 controls the mold press unit 12, the substrate stage 14, the light source 16, and the application unit 20 in a series of the imprint processes including the application of the resin, the pressing of the mold, the curing of the resin, and the release of the mold.

Moreover, the imprint apparatus 100 includes a first gas filling unit 22 and a second gas flow forming unit (second gas supply unit) 24 that serve as a gas supply means. The first gas filling unit 22 is located so as to surround the mold 11 and be held by the mold press unit 12. The first gas filling unit 22 fills a first gas 23 into the space between the resin 21 and the mold 11 and removes residual gas. The filling of the first gas 23 is performed before and after the pressing of the mold, such that the residual gas has been removed during the pressing of the mold. That is, during the application of the resin and the like, the filling of the first gas 23 is not necessary. The first gas 23 includes at least one of a permeable gas and a condensable gas. The permeable gas is dissolved or diffused in at least one of the mold 11, the resin 21, and the substrate 13. Specifically, gases such as helium or hydrogen can be adopted. However, if combustible hydrogen is used, it is necessary to separately dispose an explosion-proof system in the imprint apparatus, which has a configuration that considers fire safety. The condensable gas liquefies with the increase of pressure due to mold pressing, and the volume is reduced to several hundredths as compared with that before the liquefaction of the gas. Specifically, hydrofluorocarbon typified by pentafluoropropane can be adopted. Hydrofluoroether can also be used.

The second gas flow forming unit 24 is located between the application unit 20 and the mold press unit 12 so as to surround the first gas filling unit 22 (mold press unit 12) and is held by the structure 18. The second gas flow forming unit 24 supplies a second gas 25, forms an air flow (gas flow) that surrounds the first gas filling unit 22 (mold press unit 12), and suppresses the enter of particles. Accordingly, the need to reduce the amount of particles in the entire area of the inside of the imprint apparatus 100 is eliminated, and a space for an air conditioning system of the imprint apparatus 100 can be saved. This gas flow is also referred to as an "air curtain". The second gas 25 is supplied at all times basically in order to suppress the entry of particles. Any gas may be used as the second gas 25, as long as it has a small number of particles, for example, clean dry air. Additionally, as necessary, clean dry air that has been passed through a particle removal filter may also be used.

Note that, inside of the imprint apparatus 100, for example, a ULPA filter having a particle removal function is passed through, gas that has been cleaned is blown with a fan, thereby to reduce the particle concentration. However, even by this process, there is a case in which particles adhered to the substrate 13 that is being conveyed enters the imprint apparatus, or dust occurs from a drive unit provided in the imprint apparatus. The formation of the gas flow described above also allows suppressing the influence of such particles.

Figure 2:
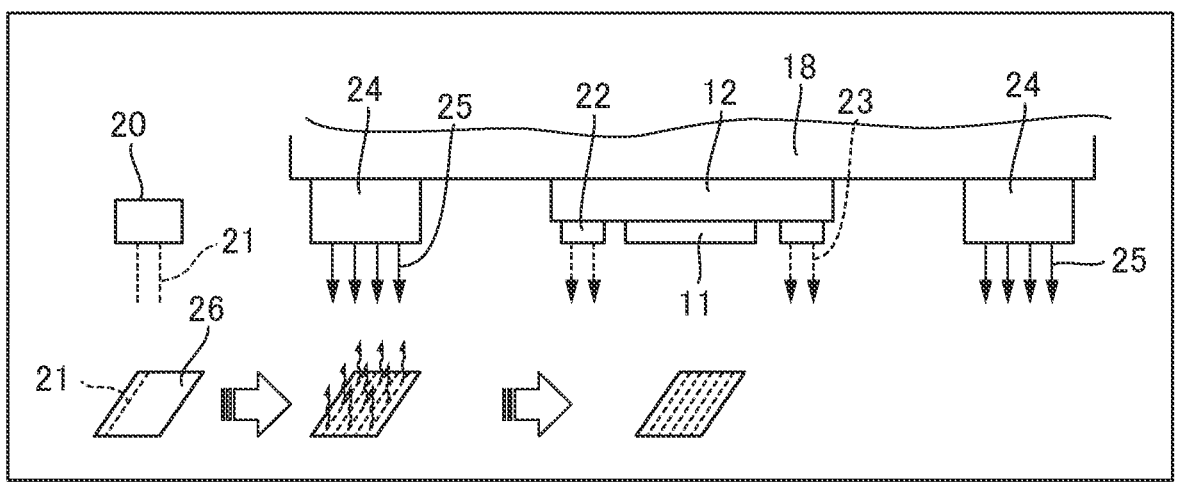
FIG. 2 illustrates a conventional imprint process.
Figure 3:
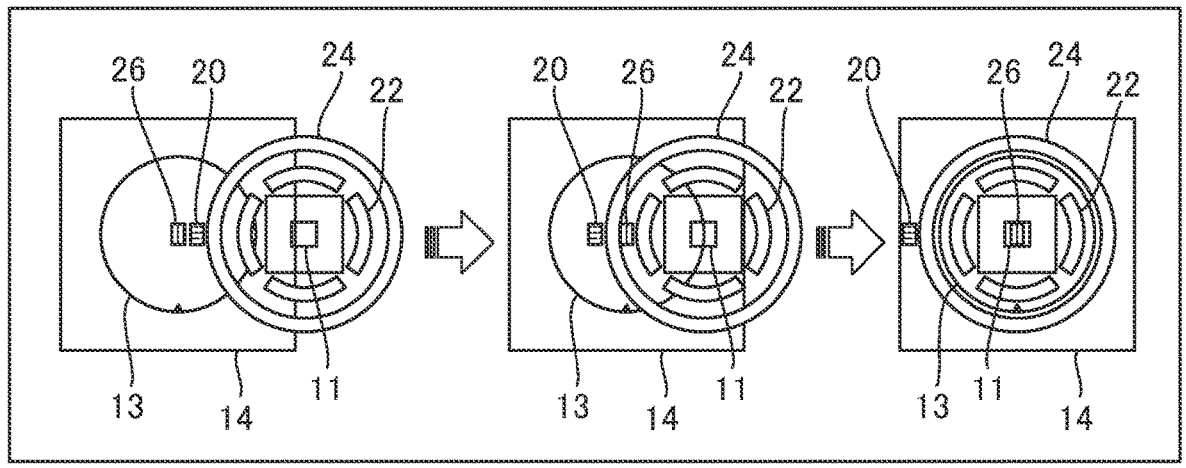
FIG. 3 illustrates a conventional imprint process.

Subsequently, a description will be given of volatilization/drying of the resin 21 by the air curtain. FIG. 2 is a schematic diagram illustrating a process in which the resin (drop) 21 that has not been cured is applied onto an imprint region (shot) 26 on the substrate 13 by the application unit 20, and the substrate 13 is moved so as to be right under the mold 11 (mold press position), seen from the side of the imprint apparatus 100. FIG. 3 illustrates the process shown in FIG. 2 seen from above. As shown in FIG. 2 and FIG. 3, the second gas flow forming unit 24 is located between the mold press unit 12 and the application unit 20. In this case, while the substrate 13 moves from the application position to the mold press position, the resin 21 on the shot 26 passes directly under the second gas flow forming unit 24. During the passage, the second gas 25 is blown over the resin 21, the resin 21 is volatized/dried, and the shape changes. As a countermeasure to the shape change, although there is a method in which the amount of the resin to be volatized/dried has been taken into account in advance and the application is performed, this method needs to estimate the amount of change in advance, the working process increases, and thereby to lower the throughput.

Figure 4:
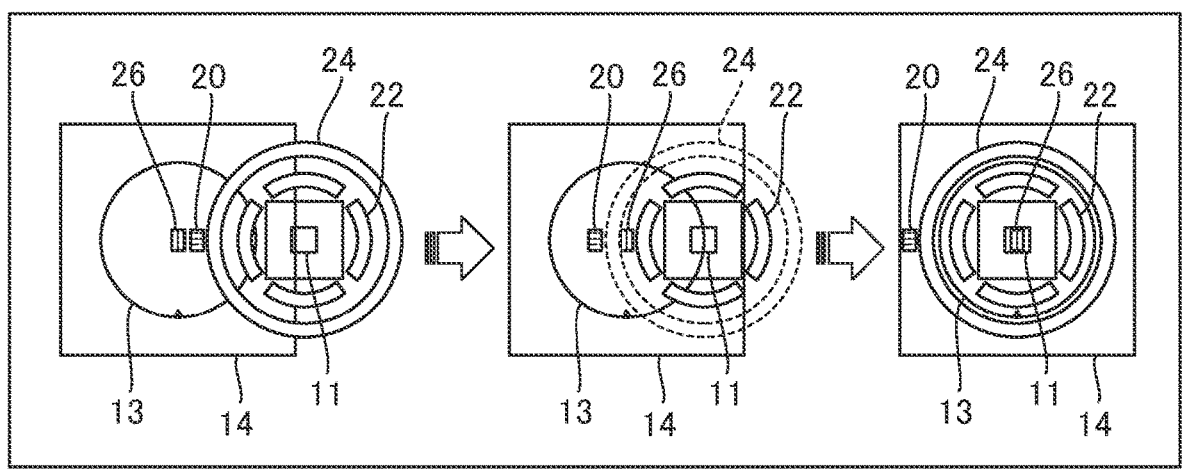
FIG. 4 illustrates an imprint process according to the first embodiment.

Accordingly, in the present embodiment, when the resin 21 that has been applied onto the shot 26 on the substrate 13 passes under the second gas flow forming unit 24, the control unit (flow volume adjustment unit) 50 performs adjustments such as the reduction of a supply quantity or a flow rate of the second gas 25 and the stopping of the supply of the second gas 25. FIG. 4 illustrates the imprint process, seen from above, and a broken line part of the second gas flow forming unit 24 represents that the reducing of the supply quantity and the flow rate of the second gas 25 and the stopping of the supply of the second gas 25 is performed. The flow volume when the substrate 13 passes under the second gas flow forming unit 24 is smaller than that when the substrate 13 is in the application position or in the mold press position. Thus, the flow volume of the gas that is supplied from the second gas flow forming unit 24 is adjusted, the blowing of the second gas 25 to the resin 21 that has not been cured is reduced, and as a result, the change of the drop shape due to the volatilization/drying is suppressed. Additionally, the adjustment of flow volume of this gas enables suppressing the mixture of the second gas 25 with the first gas 23. These lead to reduction in pattern defects.

Figure 5:
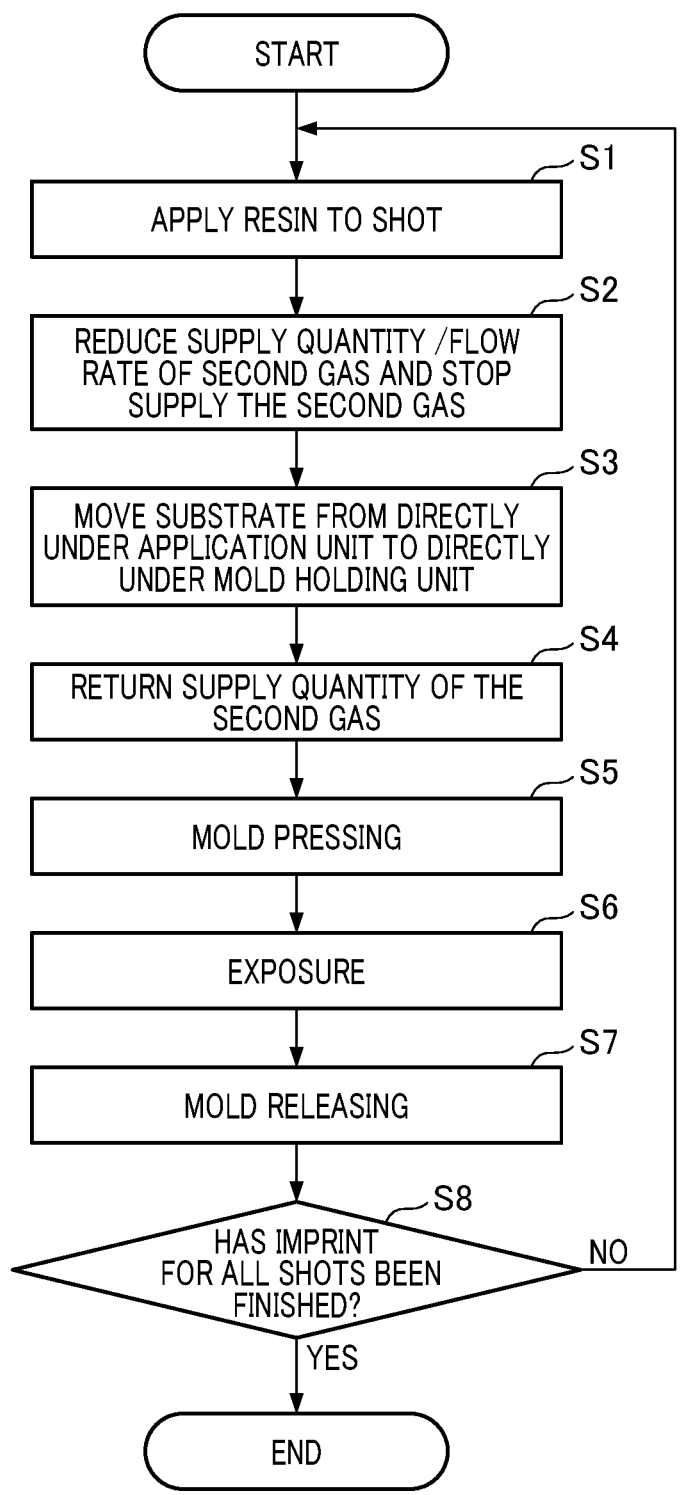
FIG. 5 is a flowchart of the imprint process according to the first embodiment and a second embodiment.

FIG. 5 is a flowchart of an imprint process in the present embodiment. In S1, the application unit 20 applies the resin 21 onto the shot 26 on the substrate 13 (application process). Subsequently, in S3, the movement of the substrate 13 to the mold press position starts (moving process). At that time, in S2, the control unit (flow volume adjustment unit) 50 performs the reduction of the supply quantity and the flow rate of the second gas 25 and the stopping of the supply of the second gas 25 by the second gas flow forming unit 24. Thus, the shape change of the drop due to the volatilization/drying of the resin 21 that has not been cured is suppressed, thereby enabling a reduction in the pattern defects. Note that S2 may be performed during S1. In S3, the substrate 13 passes directly under the second gas flow forming unit 24, and in S4, the supply quantity of the second gas 25 is returned to the original quantity. Subsequently, the substrate 13 completes the movement to the mold press position, and mold pressing (S5), exposure (S6), and mold releasing (S7) are performed. Finally, in S8, it is determined whether or not all shots have been completed, and if completed (Yes), the imprint process finishes. If all shots have not been completed (No), the imprint process continues from S1 again.

As described above, according to the present embodiment, an imprint apparatus that is advantageous in reducing pattern defects can be provided.

Second Embodiment

Figure 6:
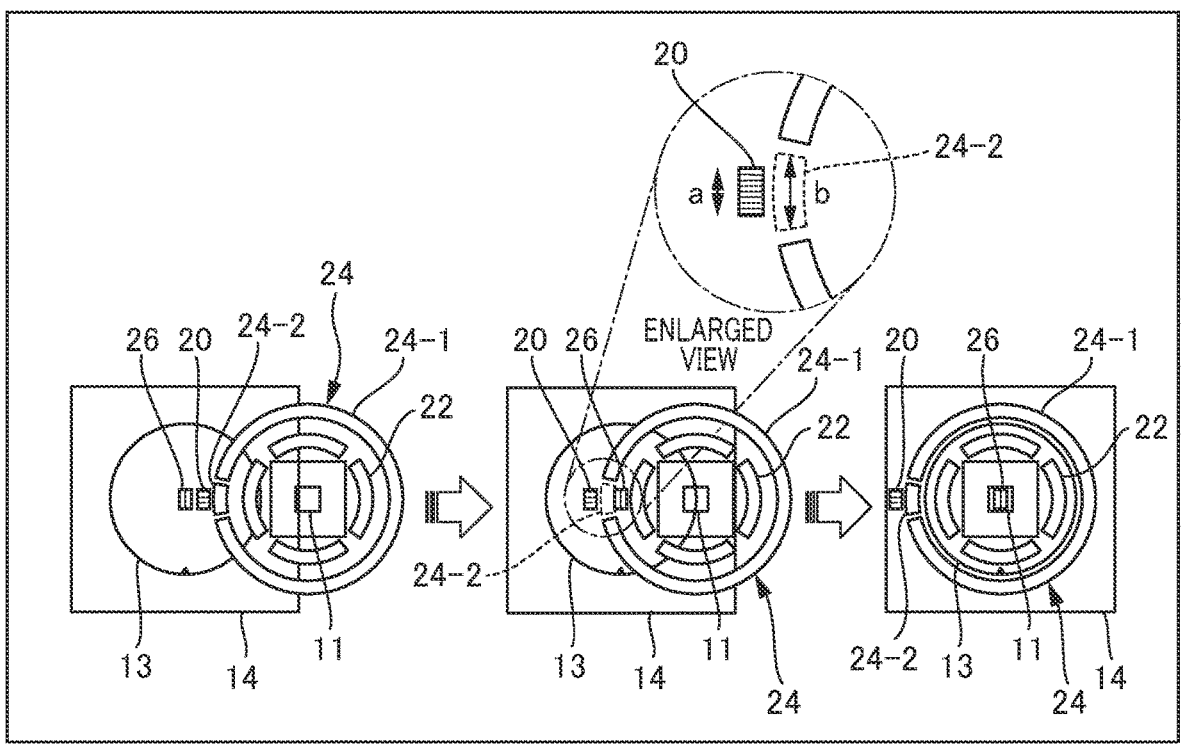
FIG. 6 illustrates an imprint process according to the second embodiment.

Next, a description will be given of the imprint apparatus 100 according to a second embodiment of the present invention. The second gas flow forming unit 24 according to the present embodiment, as shown in FIG. 6, consists of a first forming unit 24-1 and a second forming unit 24-2, and can change the supply quantity and the flow rate of the second gas 25 at each forming unit. Specifically, when the resin 21 that is applied onto the shot 26 on the substrate 13 passes under the second gas flow forming unit 24, the supply quantity and the flow rate of the second gas 25 supplied from the second forming unit 24-2 are reduced, and the supply of the second gas 25 is stopped. In contrast, it is not necessary to change the supply quantity and the flow rate of the second gas 25 supplied from the first forming unit 24-1. Note that the second gas flow forming unit 24 may be divided so as to have two or more gas supply units (a plurality of supply units) as in the present embodiment.

Additionally, as shown in the enlarged view in FIG. 6, if the nozzle width of the application unit 20 is defined as "a" and the width of the second forming unit 24-2 is defined as "b", a<b is established. That is the area of the second forming unit 24-2 is equal to or larger than that of the nozzle width of the application unit 20. Here, "a" may be the width of the resin that has actually been applied. Additionally, the second forming unit 24-2 is provided nearer to the application position than is the first forming unit 24-1. Accordingly, when the resin 21 that has not been cured passes under the second gas flow forming unit 24, it is possible to reduce the supply quantity and the flow rate of the second gas to be blown to the resin 21 that has not been cured or it is possible to stop the supply the second gas. The broken line part of the second forming unit 24-2 represents that the adjustment of the second gas has been performed. Thus, the shape change of the drop due to the volatilization/drying of the resin 21 that has not been cured is suppressed, and pattern defects can be reduced. Adjustment of the supply quantity of the second gas and the like may be carried out in a manner similar to the first embodiment. As described above, also by this embodiment, it is possible to provide an imprint apparatus that is advantageous in reducing pattern defects.

(Article Manufacturing Method)

A method of manufacturing article such as the aforementioned device (eg, a microchip, a liquid crystal display) according to an embodiment of the present invention may include a step of forming a pattern on an object (eg, wafer, glass plate, film substrate) using the aforementioned imprint apparatus. Furthermore, the article manufacturing method may include etching. When other articles such as a patterned medium (storage medium), an optical element, or the like are manufactured, the manufacturing method may include another step of processing the substrate on which a pattern has been formed instead of the etching step. The article manufacturing method of this embodiment has an advantage, as compared with a conventional article manufacturing method, in at least one of performance, quality, productivity and production cost of a device.

In the above embodiments, although a direction in which gas is supplied by the second gas supply unit serves as a direction in which gas is blown over the substrate, the present invention is not limited thereby. Additionally, the shape of the gas supply unit is also not limited to that of the nozzle.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-081355 filed Apr. 13, 2015, which is hereby incorporated by reference herein in its entirety.

What is claimed is:

1. An imprint apparatus that forms a pattern on a substrate by using a mold, the apparatus comprising:
    an imprint material supply unit configured to supply an imprint material to the substrate;
    a mold holding unit configured to hold the mold that contacts the imprint material that has been supplied to the substrate;
    a substrate stage configured to move the substrate between an imprint material supply position facing the imprint material supply unit and a contact position facing the mold held by the mold holding unit;
    a gas supply unit configured to blow out gas to form an air curtain, wherein the gas supply unit is provided so as to surround the mold when the imprint apparatus is viewed from above so that at least a part of the gas supply unit is located between the imprint material supply unit and the mold; and
    a gas flow rate adjustment unit including a control unit configured to adjust a flow rate of the gas blown out from the gas supply unit,
    wherein the control unit of the gas flow rate adjustment unit is configured to adjust the flow rate of the gas blown out from said at least a part of the gas supply unit such that the flow rate when the substrate to which the imprint material has been supplied passes directly under the gas supply unit is smaller than the flow rate when the substrate on the substrate stage is located in the contact position facing the mold held by the mold holding unit.

2. The imprint apparatus according to claim 1, wherein the control unit of the gas flow rate adjustment unit is further configured to adjust the flow rate of the gas blown out from at least the part of the gas supply unit such that the flow rate when the substrate to which the imprint material has been supplied passes directly under the gas supply unit is smaller than the flow rate when the substrate on the substrate stage is located in the imprint material supply position facing the imprint material supply unit.

3. The imprint apparatus according to claim 1, further including a gas filling unit configured to fill gas into the space between the mold and the imprint material where the mold and the substrate are brought into contact with each other,
    wherein the gas filling unit is arranged inside the gas supply unit so as to surround the mold when the imprint apparatus is viewed from above, and held by the mold holding unit.

4. The imprint apparatus according to claim 1,
    wherein the gas supply unit is divided into a plurality of gas supply units, and
    wherein the gas flow volume rate adjustment unit is configured to adjust the flow rate of the gas that is supplied by each gas supply unit of the plurality of gas supply units.

5. The imprint apparatus according to claim 4, wherein, among the plurality of gas supply units, the width of the gas supply unit that is located near the imprint material supply position is larger than that of a supply opening for the imprint material at the imprint material supply unit.

6. The imprint apparatus according to claim 4, wherein, among the plurality of gas supply units, the width of the gas supply unit that is located near the imprint material supply position is larger than that of the imprint material that has been supplied to the substrate.

7. The imprint apparatus according to claim 1, wherein the gas from the gas supply unit is clean dry air.

8. The imprint apparatus according to claim 3, wherein gas that is filled by the gas filling unit includes at least one of permeable gas and condensable gas.

9. The imprint apparatus according to claim 1, wherein the gas flow rate adjustment unit is configured to reduce the flow rate of gas or stop the flow of gas to suppress at least one of volatilization, drying, and shape change of the imprint material by the gas supplied by the gas supply unit.

10. The imprint apparatus according to claim 1, wherein the gas supply unit supplies gas flow in a direction from the mold holding unit to the substrate.

11. The imprint apparatus according to claim 3, wherein at least a part of the gas filling unit is located between the part of the gas supply unit and the mold when the imprint apparatus is viewed from above.

12. The imprint apparatus according to claim 4, wherein the control unit of the gas flow rate adjustment unit is further configured to adjust the flow rate of the gas blown from at least one of a plurality of the gas supply units located between the imprint material supply unit and the mold when the imprint apparatus is viewed from above, and not to adjust the flow rate of the gas blown out from the other of the plurality of the gas supply units, such that the flow rate when the substrate to which the imprint material has been supplied passes directly under the at least one of a plurality of the gas supply unit is smaller than the flow rate when the substrate on the substrate stage is located in the contact position facing the mold held by the mold holding unit.

* * * * *